(12) United States Patent
Chu et al.

(10) Patent No.: US 10,132,883 B2
(45) Date of Patent: Nov. 20, 2018

(54) FOLDABLE COIL ARRAY

(71) Applicant: General Electric Company, Schenectady, NY (US)

(72) Inventors: Dashen Chu, Hartland, WI (US); Scott Allen Lindsay, Dousman, WI (US); Dawei Gui, Sussex, WI (US); James Hiroshi Akao, Brookfield, WI (US); Zhu Li, Pewaukee, WI (US)

(73) Assignee: General Electric Company, Schenectady, NY (US)

( * ) Notice: Subject to any disclaimer, the term of this patent is extended or adjusted under 35 U.S.C. 154(b) by 220 days.

(21) Appl. No.: 15/169,183

(22) Filed: May 31, 2016

(65) Prior Publication Data

US 2017/0343625 A1    Nov. 30, 2017

(51) Int. Cl.
| | | |
|---|---|---|
| G01V 3/00 | (2006.01) | |
| G01R 33/341 | (2006.01) | |
| G01R 33/34 | (2006.01) | |
| G01R 33/30 | (2006.01) | |
| G01R 33/36 | (2006.01) | |
| H01F 7/20 | (2006.01) | |
| H03H 7/40 | (2006.01) | |

(52) U.S. Cl.
CPC ....... *G01R 33/34084* (2013.01); *G01R 33/30* (2013.01); *G01R 33/3614* (2013.01); *H01F 7/202* (2013.01); *H03H 7/40* (2013.01)

(58) Field of Classification Search
CPC .. G01R 33/30; G01R 33/3614; G01R 33/365; G01R 33/3415
See application file for complete search history.

(56) References Cited

U.S. PATENT DOCUMENTS

| 5,548,218 | A | 8/1996 | Lu | |
|---|---|---|---|---|
| 6,639,406 | B1 | 10/2003 | Boskamp et al. | |
| 7,106,062 | B1 | 9/2006 | Hardy et al. | |
| 7,253,622 | B2 | 8/2007 | Saylor et al. | |
| 7,365,542 | B1* | 4/2008 | Rohling | G01R 33/34084 |
| | | | | 324/318 |
| 7,474,098 | B2* | 1/2009 | King | G01R 33/3415 |
| | | | | 324/318 |
| 7,548,064 | B1 | 6/2009 | Wang et al. | |

(Continued)

OTHER PUBLICATIONS

International Search Report and Written Opinion for International Application No. PCT/US2017/034936, dated Aug. 2, 2017. 12 pages.

*Primary Examiner* — Minh N Tang
(74) *Attorney, Agent, or Firm* — McCoy Russell LLP (57) ABSTRACT

In one example, an RF coil array includes a first RF coil configured to generate a magnetic field along a first axis, the first RF coil having a first surface, a second RF coil configured to generate a magnetic field along a second axis, orthogonal to the first axis, the second RF coil having a second surface, and a first foldable interconnect coupling the first RF coil to the second RF coil. The first foldable interconnect may be adjusted to couple the first RF coil to the second RF coil with a first amount of overlap and with the first surface and second surface facing a common direction, or couple the first RF coil to the second RF coil with a second amount of overlap, larger than the first amount of overlap, and with the first surface in face to face position with the second surface.

12 Claims, 7 Drawing Sheets

(56) References Cited

U.S. PATENT DOCUMENTS

| | | | |
|---|---|---|---|
| 7,804,300 B2 * | 9/2010 | Possanzini | G01R 33/3415 324/318 |
| 7,999,548 B1 | 8/2011 | Brown et al. | |
| 2003/0197507 A1 | 10/2003 | Liu | |
| 2008/0100294 A1 | 5/2008 | Rohling et al. | |
| 2013/0093425 A1 | 4/2013 | Chu et al. | |

* cited by examiner

FOLDABLE COIL ARRAY

FIELD

Embodiments of the subject matter disclosed herein relate to non-invasive diagnostic imaging, and more particularly, to magnetic resonance imaging systems.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field. When a human body, or part of a human body, is placed in the main magnetic field, the nuclear spins that are associated with the hydrogen nuclei in tissue water or fat become polarized. This means that the magnetic moments that are associated with these spins become preferentially aligned along the direction of the main magnetic field, resulting in a small net tissue magnetization along that axis. An MRI system also comprises components called gradient coils that produce smaller amplitude, spatially varying magnetic fields when a current is applied to them. Typically, gradient coils are designed to produce a magnetic field component that is aligned along the z-axis and that varies linearly in amplitude with position along one of the x, y, or z-axes. The effect of a gradient coil is to create a small ramp on the magnetic field strength and, in turn, on the resonant frequency of the nuclear spins along a single axis. Three gradient coils with orthogonal axes are used to "spatially encode" the MRI signal by creating a signature resonance frequency at each location in the body. Radio frequency (RF) coils are used to create pulses of RF energy at or near the resonance frequency of the hydrogen nuclei. The RF coils are used to add energy to the nuclear spins in a controlled fashion. As the nuclear spins then relax back to their rest energy state, they give up energy in the form of an RF signal. This signal is detected by the MRI system and is transformed into an image using a computer and know reconstruction algorithms.

Sizing of RF coil arrays may include a trade-off between adequate coverage of a region of interest to be imaged and suitable signal-to-noise ratios. For example, RF coil arrays need to be large enough to receive MR signals from the anatomy region of interest. On the other hand, the RF coil arrays cannot be made too large, otherwise the signal to noise ratio (SNR) of the arrays will be degraded due to the poor fitting factor of large coil arrays and large size of coil elements. This trade-off is complicated by the large variability of patient sizes. A given RF coil array may be too small to provide sufficient coverage to large size patients, yet the same coil array may be too big to fit the small size patients and result in low SNR or poor image quality. Thus, one fixed size of coil arrays may not fit all patients. However, the cost and complexity associated with multiple different sized RF coils arrays may preclude the use of different sized coils, thus degrading imaging for at least some patients.

BRIEF DESCRIPTION

In one embodiment, a foldable radiofrequency (RF) coil array includes a first RF coil configured to generate a magnetic field along a first axis, the first RF coil having a first surface, a second RF coil configured to generate a magnetic field along a second axis, orthogonal to the first axis, the second RF coil having a second surface, and a first foldable interconnect coupling the first RF coil to the second RF coil. In an unfolded configuration, the first foldable interconnect is configured to couple the first RF coil to the second RF coil with a first amount of overlap and with the first surface and second surface facing a common direction, and in a folded configuration, the first foldable interconnect is configured to couple the first RF coil to the second RF coil with a second amount of overlap, larger than the first amount of overlap, and with the first surface in face to face position with the second surface.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 3A-4B schematically show an example foldable RF coil array.

DETAILED DESCRIPTION

Figure 5:
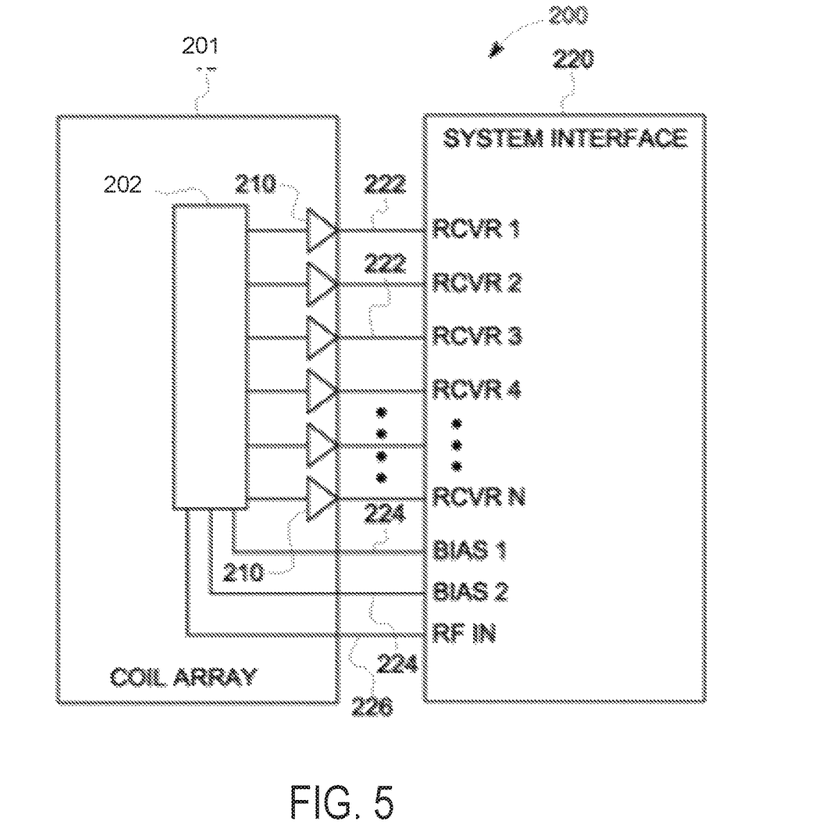
FIG. 5 is a block diagram of an embodiment of a receive section of a magnetic resonance imaging (MRI) system including a foldable RF coil array.
Figure 6:
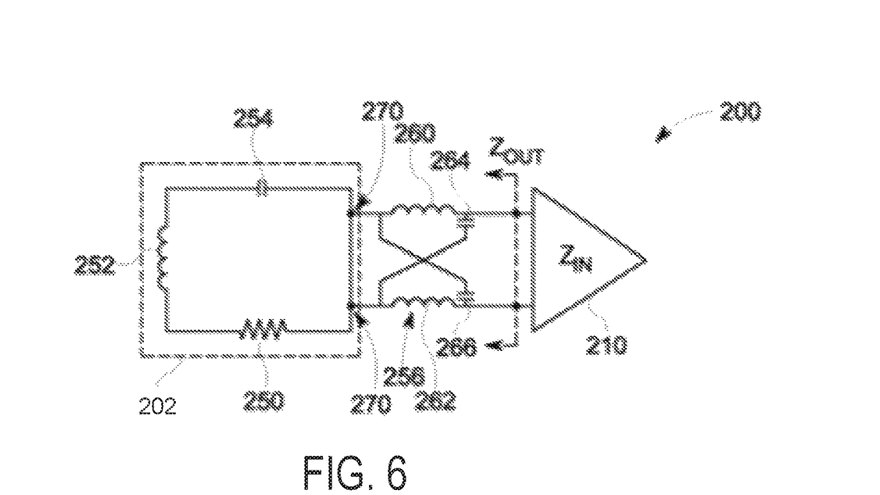
FIG. 6 is a schematic diagram of a portion of the receive section shown in FIG. 5 illustrating an embodiment of a RF receiver coil and an embodiment of a corresponding preamplifier of the receive section.
Figure 7:
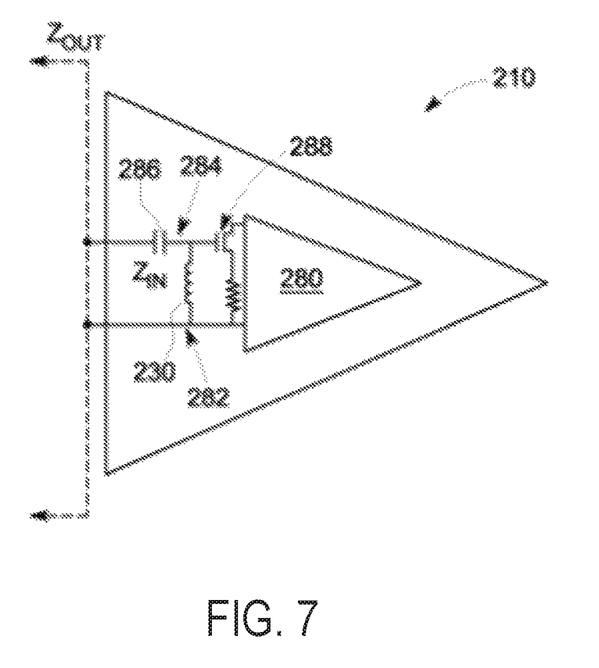
FIG. 7 is a schematic diagram illustrating an embodiment of the preamplifier shown in FIG. 6.

The following description relates to various embodiments of medical imaging systems. In particular, methods and systems are provided for a foldable radiofrequency (RF) coil array. An example of a magnetic resonance imaging (MRI) system that may be used to acquire images is provided in FIG. 1. The MRI system of FIG. 1 may include one or more foldable RF coil arrays, as illustrated in FIGS. 3A-4B. The one or more foldable RF coil arrays may be comprised RF coils having loop and butterfly geometries, such as the butterfly and loop coils illustrated in FIGS. 2A and 2B. Each RF coil of the foldable RF coil array may be part of a receive circuit that includes a preamplifier, as shown in FIGS. 5-7. The MR signals received by the foldable RF coil array may be used to reconstruct an image of a region of interest according to the method illustrated in FIG. 8.

As explained previously, MRI imaging systems use RF coils to acquire image information of a region of interest of a scanned object. The resultant image that is generated shows the structure and function of the region of interest. Conventional MRI imaging systems may include a multiple-channel coil array having a plurality of coil elements. The signals detected by the multiple-channel array coil are processed by a computer to generate MR images of the object being imaged. During operation, the plurality of coil elements may be inductively or capacitively decoupled from the other coil elements. Further, the plurality of coil elements may be maintained at a fixed distance from each other to maintain desired coil isolation. Thus, the overall coverage of a conventional RF coil is also fixed. However, RF arrays are typically sized to be utilized with a patient having an average size. Thus, if the patient is larger or smaller than the average patient, the RF coil array may be too large or too small to properly fit the patient. As a result, in operation the RF coil may not provide sufficient information of the patient being imaged. To accommodate larger and smaller patients, some medical facilities may choose to purchase RF array coils having different sizes to accommodate patients having different sizes. However, the costs of such RF coils arrays may limit the quantity of medical providers capable of expending the additional financial resources required to purchase RF coil arrays having different sizes.

According to embodiments disclosed herein, a foldable RF coil array is adjustable between a partial overlap configuration (also referred to as an unfolded configuration) and a full overlap configuration (also referred to as a folded configuration). In the partial overlap, unfolded configuration, the RF coil array may be longer or wider in order accommodate imaging of relatively large patients or allow imaging of a relatively large portion of anatomy. In the full overlap, folded configuration, the RF coil array may be shorter or narrower to accommodate imaging of smaller patients or smaller portions of anatomy. An operator may easily adjust the configuration of the foldable RF coil array, thus preventing the need to keep multiple different sized RF coil arrays on hand, and hence reducing cost.

Figure 1:
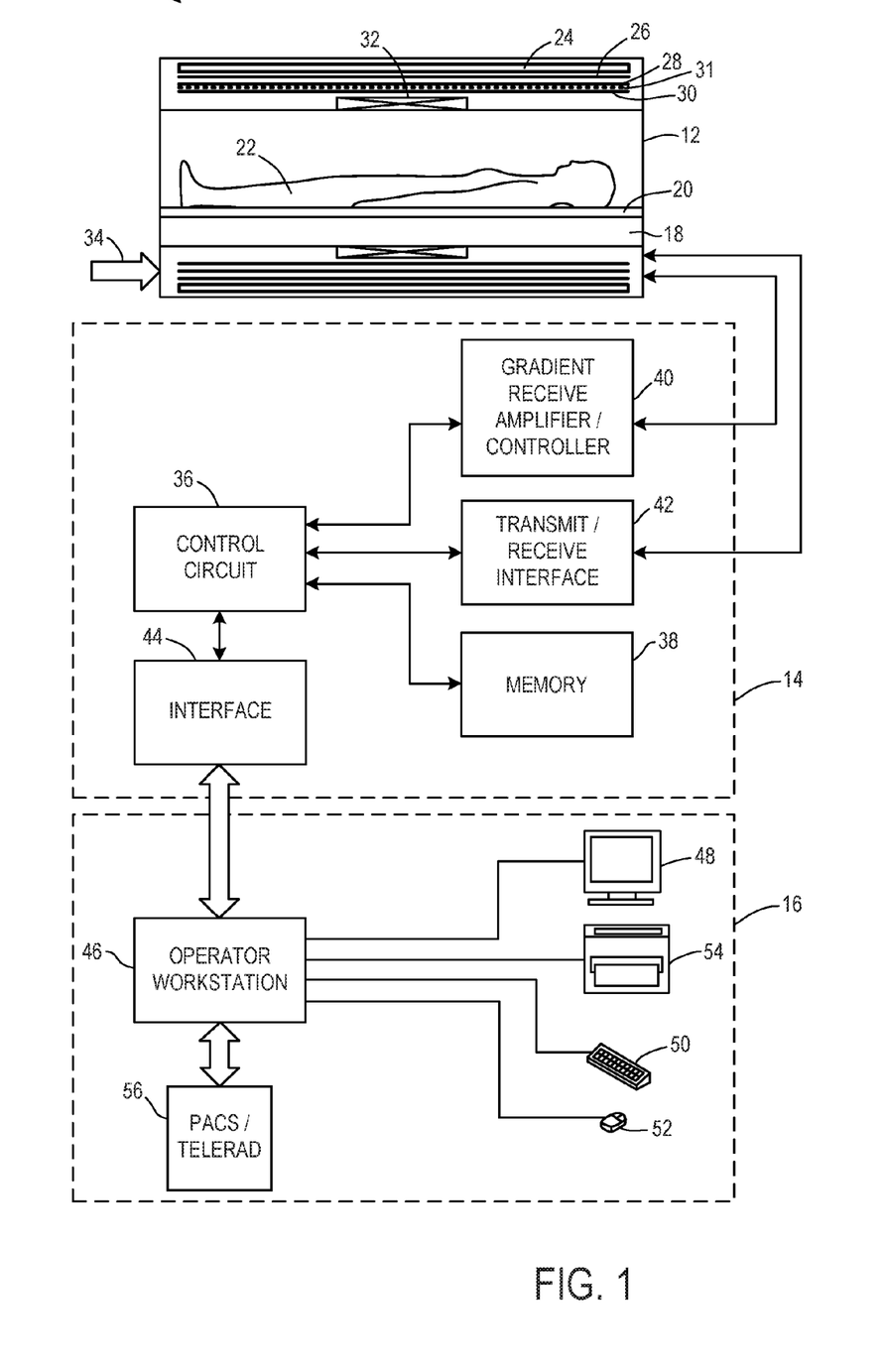
FIG. 1 shows a diagrammatical representation of an MRI system.

Turning now to the drawings, and referring first to FIG. 1, a magnetic resonance imaging (MRI) system 10 is illustrated diagrammatically as including a scanner 12, scanner controller circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28, and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference number 34. In the embodiment illustrated in FIG. 1, the RF coil 32 may also serve as a receiving coil. Thus, the RF coil 32 may be coupled with receiving and driving circuitry in passive and active modes for receiving emissions from the gyromagnetic material and for applying RF excitation pulses, respectively. Alternatively, various configurations of receiving coils may be provided separate from RF coil 32. Such coils may include structures specially adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars, or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The gradient coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in a rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogeneous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

One or more shielding coils, such as shielding coil 31, may be present. The shielding coil 31 comprises turns of a conductive material configured to carry current in an opposite direction as a respective gradient coil, such as coil 30. Like the primary coil, the shielding coil includes a shielding x-coil, a shielding y-coil, and a shielding z-coil. The shielding coil 31 is configured to create a magnetic field that is substantially the opposite of the field created by the primary coil for regions outside of the shielding coil 31. For example, the shielding coil 31 is designed to minimize the stray fields from the primary coil that might otherwise induce eddy currents in other conducting structures, such as a cryostat (not shown). It is important to minimize the production of eddy currents in order to prevent the generation of time-varying magnetic fields that would otherwise negatively impact the performance of the MRI system.

The pulsed gradient fields may perform various functions integral to the imaging process. Some of these functions are slice selection, frequency encoding, and phase encoding. These functions can be applied along the x-, y-, and x-axes of the original coordinate system or along other axes determined by combinations of pulsed current applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phases differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radio frequency pulses. In the diagrammatical view of FIG. 1, the control circuitry 14 thus includes a control circuit 36 for commanding the pulse sequences employed during the examinations, and for processing received signals. The control circuit 36 may include a suitable programmable logic device, such as a CPU or digital signal processor. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference number 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference number 56 in FIG. 1. Such devices may include picture archiving and communications systems (PACS), teleradiology systems (telerad), and the like.

Figure 2A:
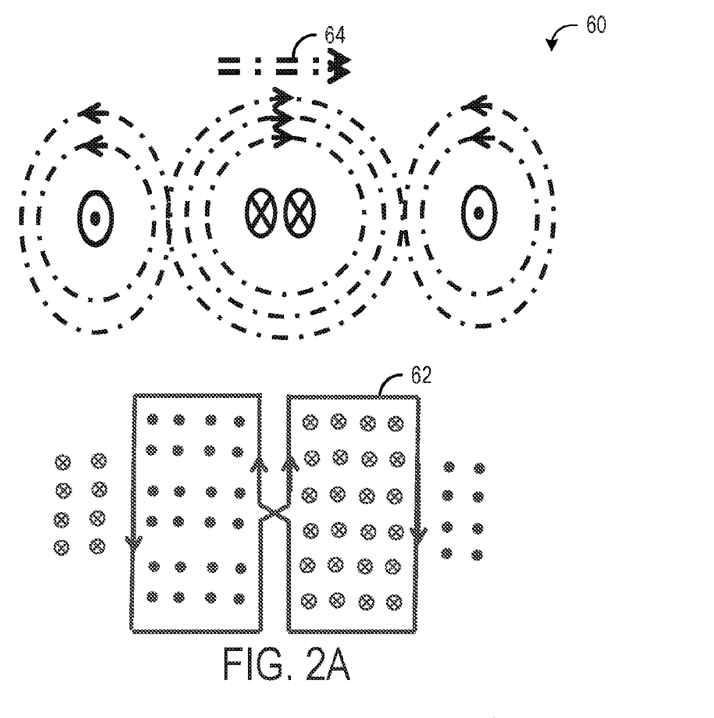
FIGS. 2A and 2B schematically show example radiofrequency (RF) coil geometries.

FIGS. 2A and 2B show schematic diagrams of example RF coil geometries that may be utilized in an RF coil array of the current disclosure. FIG. 2A is a diagram 60 illustrating the magnetic field generated by butterfly coil 62. Butterfly coil 62 may include a figure-eight geometry, resulting in the illustrated magnetic fields when the butterfly coil is driven. An overall B1 field 64 is generated, having a directionality along a first axis (e.g., an x-axis or horizontal axis in the illustrated diagram). During pulsation of the butterfly coil, the rotating RF magnetic field, B1, is applied to tip the magnetization of the main magnetic field (B0) generated by the main magnet into a plane that is transverse to B0. When butterfly coil 62 is in a receive mode, rather than generating the illustrated magnetic field due to pulsation from a voltage source, the butterfly coil may be sensitive to magnetic flux in the illustrated direction.

Figure 2B:
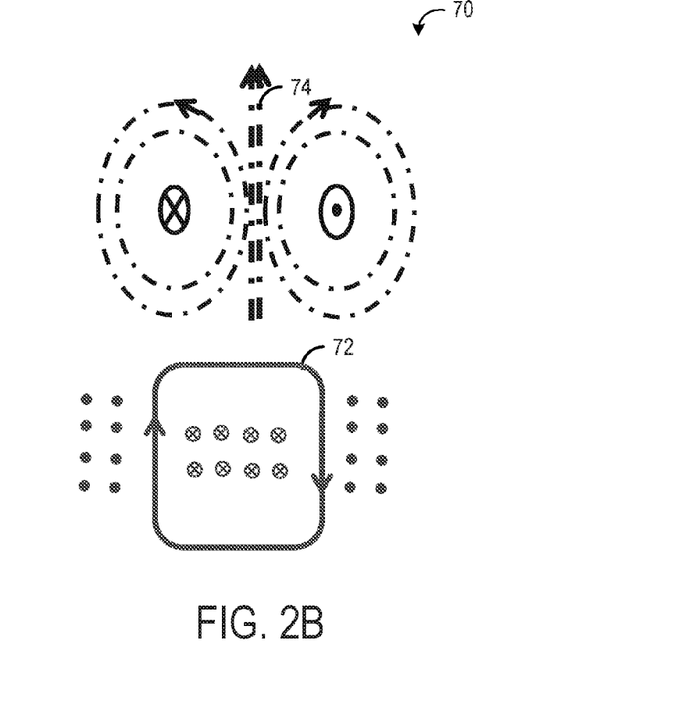

FIG. 2B is a diagram 70 illustrating the magnetic field generated by loop coil 72. Loop coil 72 may include a single loop geometry, resulting in the illustrated magnetic fields when the loop coil is driven. An overall B1 field 74 is generated, having a directionality along a second axis (e.g., a y-axis or vertical axis in the illustrated diagram). During pulsation of the loop coil, the rotating RF magnetic field, B1, is applied to tip the magnetization of the main magnetic field (B0) generated by the main magnet into a plane that is transverse to B0. The butterfly coil 62 generates a B1 field that is orthogonal to the B1 field generated by the loop coil 72. When loop coil 72 is in a receive mode, rather than generating the illustrated magnetic field due to pulsation from a voltage source, the loop coil may be sensitive to magnetic flux in the illustrated direction.

Figure 3A:
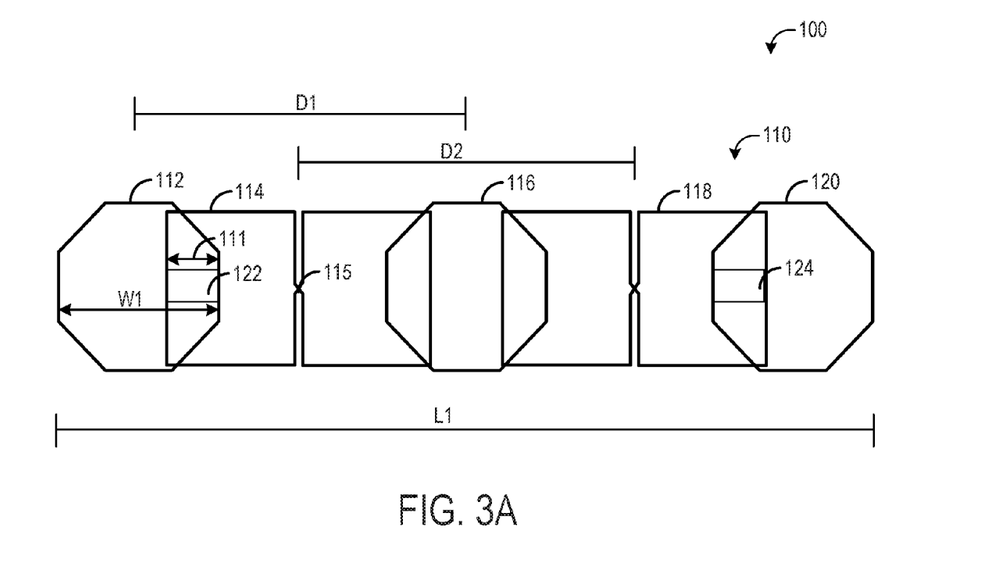
Figure 3B:
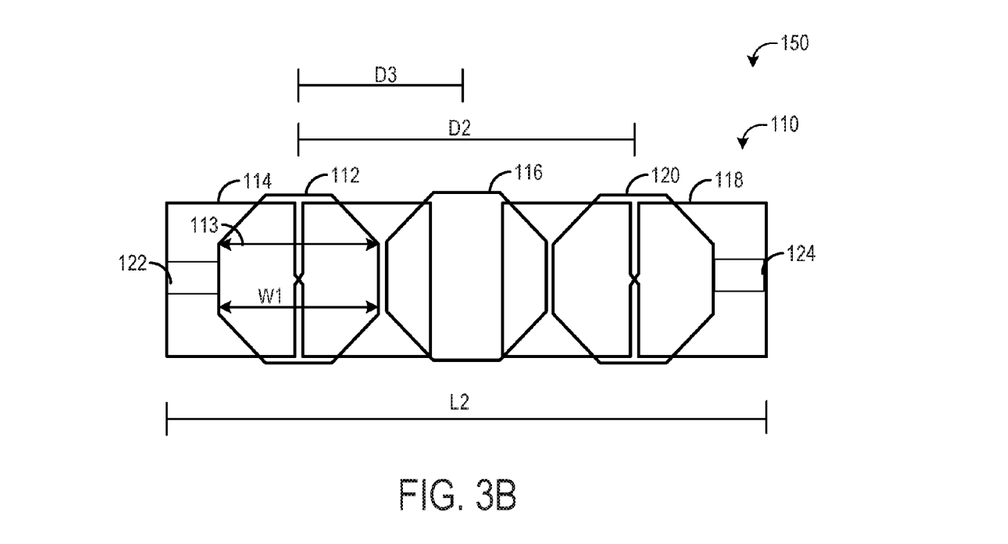

FIGS. 3A and 3B illustrate an example RF coil array 110 that is configured to operate in either an unfolded configuration or in a folded configuration. The RF coil array 110 may be a non-limiting example of RF coil 32 of FIG. 1 and may be configured as a receive-only coil array.

FIG. 3A shows the RF coil array 110 in an unfolded configuration 100. RF coil array 110 is comprised of a plurality of individual RF coils arranged in a row. The RF coils may be surface coil elements comprised of a generally flexible, flat, conductive material, for example, tin-plated copper. The RF coils may be mounted on a flexible substrate (not shown in FIG. 3A). The flexible substrate may be fabricated from a substantially RF transparent material. For example, the substrate may be fabricated from a cloth material or any other suitable material that is flexible to enable the RF coils to be repositioned as described herein.

As shown, RF coil array 110 is comprised of five individual RF coils, first RF coil 112, second RF coil 114, third RF coil 116, fourth RF coil 118, and fifth RF coil 120, although more or fewer coils could be included without departing from the scope of the disclosure. First RF coil 112, third RF coil 116, and fifth RF coil 120 may each have a loop coil geometry, and thus may generate a B1 magnetic field along a first axis, which in one example may be parallel to the longitudinal axis of the coil array. Second RF coil 114 and fourth RF coil 118 may each have a butterfly coil geometry, and thus may generate a B1 magnetic field along a second axis, orthogonal to the first axis. In one example, the second axis may be perpendicular to the longitudinal axis of the coil array.

Each of the first RF coil 112, second RF coil 114, third RF coil 116, fourth RF coil 118, and fifth RF coil 120 may have a first surface facing a common direction (e.g., up/outward) in the unfolded configuration and a second surface, opposite the first surface, that faces the flexible substrate in the unfolded configuration. Further, each butterfly coil may have a cross-over region 115 located in the center of the butterfly coil. In the unfolded configuration, the first RF coil 112 does not overlap the cross-over region 115. Likewise, the fifth RF coil 120 does not overlap the cross-over region of fourth RF coil 118.

First RF coil 112 may be coupled to second RF coil 114 via a first foldable interconnect 122. The first foldable interconnect 122 may include a hinge or other mechanism to allow manual adjustment of a position of first RF coil 112 relative to second RF coil 114. Likewise, fifth RF coil 120 may be coupled to fourth RF coil 118 via a second foldable interconnect 124. The second foldable interconnect 124 may include a hinge or other mechanism to allow manual adjustment of a position of fifth RF coil 120 relative to fourth RF coil 118. In other examples, the foldable interconnects may be dispensed with, and rails or other coupling elements may be provided to facilitate sliding of the first and fifth RF coils.

RF coil array 110, while in the unfolded configuration 100, may have an overall length L1 that is defined from a first, outermost edge of first RF coil 112 to a second, outermost edge of fifth RF coil 120. The RF coils in RF coil array 110 may be arranged symmetrically, such that a distance D1 between first RF coil 112 and third RF coil 116 is equal to a distance between third RF coil 116 and fifth RF coil 120. As shown, distance D1 includes a distance from a center-point of first RF coil 112 to a center-point of third RF coil 116. A second distance D2 may include a distance from a center-point of second RF coil to a center-point of fourth RF coil 118.

As shown, each RF coil of RF coil array 110 overlaps at least one other RF coil. For example, first RF coil 112 overlaps second RF coil 114, second RF coil 114 overlaps both first RF coil 112 and third RF coil 116, third RF coil overlaps both second RF coil 114 and fourth RF coil 118, fourth RF coil overlaps both third RF coil 116 and fifth RF coil 120, and fifth RF coil overlaps fourth RF coil 118. Each RF coil may overlap an adjacent RF coil by a suitable amount, based on desired imaging parameters and system configuration. However, the amount of overlap may be relatively small, such that adjacent RF coils do not overlap each other by more than 50% of an RF coil's respective width. For example, first RF coil 112 may overlap second RF coil by an amount corresponding to 10% of the overall width of first RF coil 112. As shown, first RF coil 112 has a width W1, and an overlap width 111 may comprise 10% of W1.

In some examples, one or more RF coils may be arranged such that no overlap exits between that RF coil and an adjacent RF coil; in an example, no overlap may exist between any of the RF coils of RF coil array 110 when in the unfolded configuration.

FIG. 3B shows RF coil array 110 in a folded configuration 150. To move RF coil array 110 from the unfolded to the folded configuration, an operator may manually move first RF coil 112 from an unfolded first position to a folded second position, causing first foldable interconnect 122 to swing, fold, or otherwise hinge in order to facilitate movement of first RF coil 112. When in the folded second position, first RF coil 112 may fully overlap with second RF coil 114, e.g., 100% of the width W1 of first RF coil 112 may overlap with second RF coil 114, as shown by overlap width 113 being equal to W1. As such, first RF coil 112 may lie on top of second RF coil 114. In the folded configuration, the first surface of the first RF coil 112 may in a face to face position with the first surface of the second RF coil 114. In the face to face to position, the first surfaces may face each other, and may be in full or partial contact. In other examples, the first surfaces may face each other but may not make contact with each other. In this way, the first RF coil 112 may be rotated such that its first surface is flipped to face the flexible substrate. The first RF coil 112 may fully overlap the cross-over region 115 of the second RF coil 114. Additionally, each of the first RF coil 112 and second RF coil 114 may have a center point, and when folded, the center points may align. Further, each of the first RF coil 112 and second RF coil 114 may have a central longitudinal axis and a central lateral axis that each pass through a respective center point, and when folded, the central longitudinal axes of the two coils may align and the central lateral axes of the two coils may align. The net magnetic flux from the butterfly or loop coil is zero if the butterfly coil and the loop coil share the same axis since the incoming flux is equal to outgoing flux (as illustrated in the magnetic flux diagrams of FIGS. 2A and 2B), which results in zero coupling between a butterfly and a loop coil.

Likewise, an operator may move fifth RF coil 120 from an unfolded first position to a folded second position, causing second foldable interconnect 124 to swing, fold, or otherwise hinge in order to facilitate movement of fifth RF coil 120. When in the folded second position, fifth RF coil 120 may fully overlap with fourth RF coil 118, e.g., 100% of the width of fifth RF coil 120 may overlap with fourth RF coil 118. As such, fifth RF coil 120 may lie on top of fourth RF coil 118. In the folded configuration, the first surface of the fifth RF coil 120 may in a face to face position with the first surface of the fourth RF coil 118. In the face to face to position, the first surfaces may face each other, and may be in full or partial contact. In other examples, the first surfaces may face each other but may not make contact with each other. In this way, the fifth RF coil 120 may be rotated such that its first surface is flipped to face the flexible substrate. Additionally, each of the fourth RF coil 118 and fifth RF coil 120 may have a center point, and when folded, the center points may align. Further, each of the fourth RF coil 118 and fifth RF coil 120 may have a central longitudinal axis and a central lateral axis that each pass through a respective center point, and when folded, the central longitudinal axes of the two coils may align and the central lateral axes of the two coils may align.

Once RF coil array 110 is in the folded configuration, RF coil array 110 may have a second length L2 defined from a first outermost edge of second RF coil 114 to a second outermost edge of fourth RF coil 118. The second length L2 may be shorter than the first length L1 of the RF coil array 110 in the unfolded configuration. Further, the folded RF coil array 110 may have a third distance D3 between first RF coil 112 and third RF coil 116 that is smaller than first distance D1. Likewise, the distance between the fifth RF coil 120 and third RF coil 116 may be smaller than the first distance D1. However, the second distance D2 may be maintained constant in the unfolded and folded configurations. In one example, the first distance D1 may be equal to or greater than the second distance D2 and the third distance D3 may be less than the second distance D2.

As explained previously, RF coil arrays may be designed to reduce and/or compensate for the mutual inductance (also referred to as coupling) between adjacent RF coils. However, placing one RF coil on top of another RF coil (e.g., fully overlapping the coils) may induce a high amount of coupling between the RF coils, which may degrade imaging. Thus, to minimize RF coil coupling when in the folded configuration, the first RF coil 112 may generate a magnetic field that is orthogonal to the magnetic field generated by the second RF coil 114. As one example, first RF coil 112 may be of a loop configuration while second RF coil 114 may be of a butterfly configuration. As such, when first RF coil 112 is brought into full overlap with second RF coil 114, essentially no coupling between the two RF coils occurs. While the quadrature coil geometry described herein (e.g., a loop and a butterfly coil) may result in isolated RF coils, other configurations may be possible. For example, first RF coil 112 may be rotated relative to second RF coil 114 in order to generate a magnetic field that is orthogonal to the magnetic field generated by the second RF coil.

Further, as explained above, in the folded configuration, the distance between adjacent loop coils (e.g., between first RF coil 112 and third RF coil 116, and between third RF coil 116 and fifth RF coil 120) is greatly reduced relative to the unfolded configuration. For example, as shown in FIGS. 3A and 3B, the edges of first RF coil 112 and third RF coil 116 may be brought into (or close to) contact when in the folded configuration, but may be spaced well apart in the unfolded configuration. This close positioning of the loop coils (which generate magnetic fields along the same axis) may cause coupling of the RF coils, degrading imaging. To counteract this coupling, high source impedance preamplifiers may be included in the RF coil circuit, which will be explained in more detail below with respect to FIGS. 5-7.

Thus, an RF coil array comprising two or more RF coils may be configured to have an unfolded configuration, where overlap between two adjacent RF coils is at a minimum amount, and a folded configuration, where overlap between at least two adjacent RF coils is a maximum amount. By providing a foldable RF coil array, an appropriate size RF coil array may be selected for a given patient size and/or type of anatomy being imaged. For example, the unfolded configuration may be selected for a relatively large (e.g., tall) patient, while the folded configuration may be selected for a relatively small (e.g., short) patient. In another example, the unfolded configuration may be selected for imaging a torso, while the folded configuration may be selected for imaging a head. In this way, a cost-effective mechanism may be provided for imaging a wide variety of patient types and anatomy.

Additionally, the folded configuration may provide increased signal-to-noise ratio (SNR) relative to the unfolded configuration, and also relative to standard, four loop RF coil arrays. For example, a standard four-loop RF coil array having a length equal to the folded configuration of the RF coil array 110 of FIG. 3B may have an SNR of 124 for a given set of imaging conditions, while the folded configuration described herein may have an SNR at the same imaging conditions of 153, resulting in an increased SNR of 23%. The unfolded configuration may result in an SNR of 135 for the given imaging conditions, an increase of 9% over the standard four-loop RF coil array. Thus, by providing two sets of fully overlapping RF coils, the folded configuration of the RF coil array described herein may increase SNR, even relative to an RF coil array of equal length.

Further, the unfolded configuration of the RF coil array 110 illustrated in FIG. 3A may improve parallel imaging relative to the folded configuration, due to the spacing between the coils in the unfolded configuration. Parallel imaging results in scan time reduction, resolution enhancement, artifact suppression, and, even attenuation of noise. In a general sense, parallel imaging utilizes the difference in sensitivities between individual coils of a receiver array to reduce the number of gradient encoding steps required for imaging. Thus, in parallel MRI, an array of receiver coils with different sensitivities is used to receive the signal in parallel, facilitating combination of these obtained signals to reconstruct the full image.

There are several parallel MRI approaches, including SMASH (SiMultaneous Acquisition of Spatial Harmonics) and SENSE (SENSitivity Encoding). For pulse sequences that execute a rectilinear trajectory in k space, these techniques reduce the number of phase encoding steps in order to reduce imaging time, and then use array sensitivity information to make up for the loss of spatial information.

In order to make the coils in the array sufficiently spatially distinct, and thus improve their signal-to-noise ratio (SNR) for accelerated imaging, it is common to leave gaps between neighboring coils in the array. This, however, has the drawback of increasing the coupling between coils, which can in turn degrade performance. To overcome this limitation, the coils in the array may be overlapped by an amount that minimizes the mutual inductance between neighboring coils. When such an array is employed for parallel imaging, the SNR decreases, because the geometry factor of the array has increased.

Thus, RF coil array design may include a trade-off between allowing parallel imaging by providing spatially distinct coils, while reducing coupling between coils and providing adequate SNR. However, the RF coil array of the current disclosure may reduce these trade-offs by providing distinct coil array geometries in different configurations. For example, an operator may choose to increase SNR by utilizing the coil array in the folded configuration or the operator may choose to perform parallel imaging by utilizing the coil array in the unfolded configuration.

In some examples, the RF coil array 110 described with respect to FIGS. 3A and 3B may form part of a larger RF coil array. In such an example, the RF coil array 110 may comprise an RF coil array element, and multiple RF coil array elements may be included in the larger RF coil array. An example of a larger RF coil array configured to be used in a folded or unfolded configuration is illustrated in FIGS. 4A and 4B.

Figure 4A:
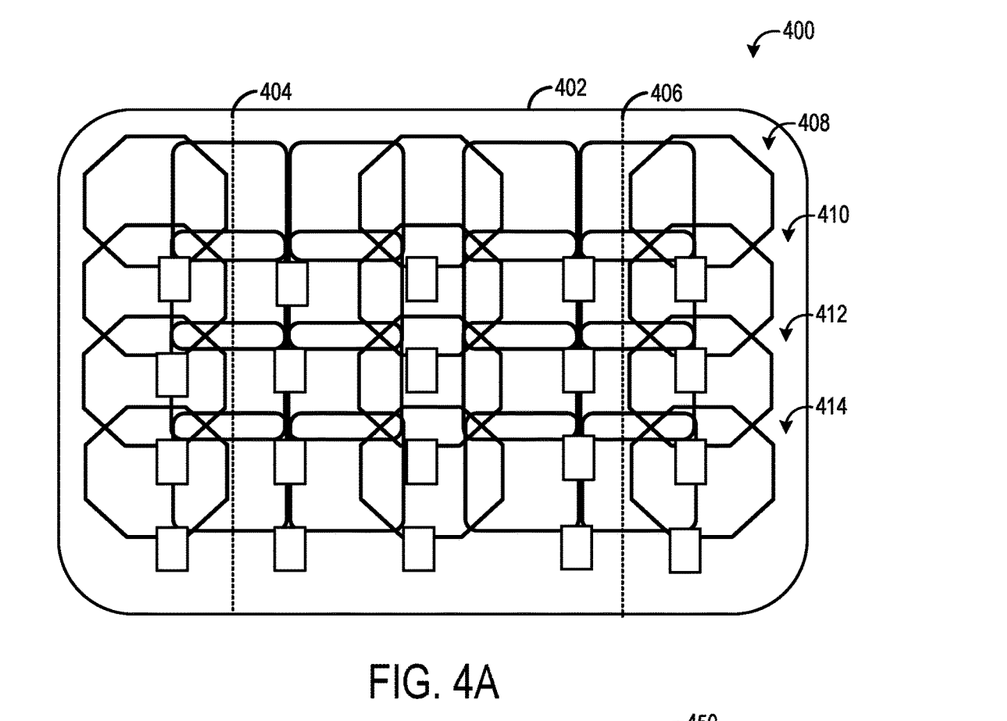
Figure 4B:
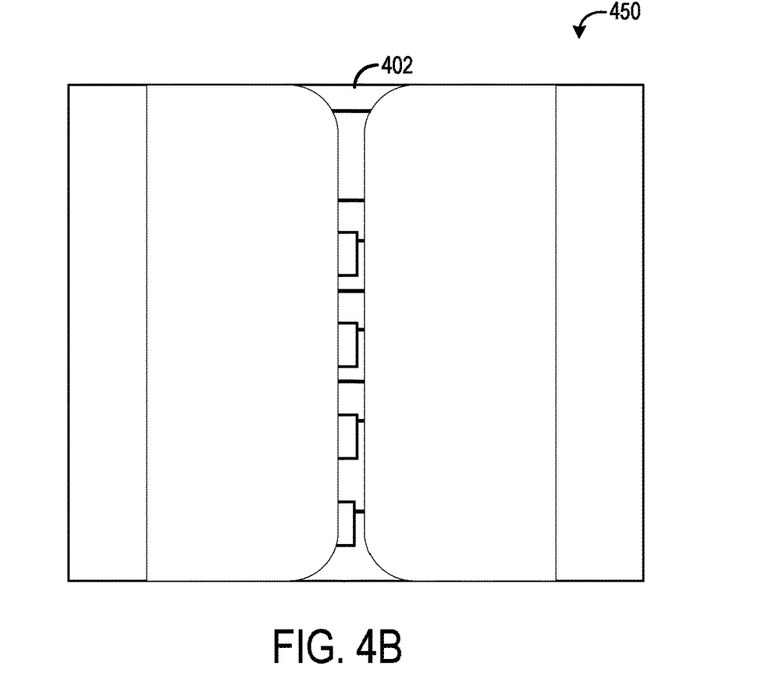

FIG. 4A shows a foldable RF coil array 400 in an unfolded configuration, comprising a plurality of RF coil array elements. Each RF coil array element may comprise a row of RF coil array 400. As shown, RF coil array 400 includes a first RF coil array element 408, a second RF coil array element 410, a third RF coil array element 412, and a fourth RF coil array element 414, although more or fewer RF coil array elements may be included without departing from the scope of this disclosure. Each RF coil array element may be comprised of alternating loop and butterfly RF coils, as explained above with respect to FIG. 3A. Thus, RF coil array 400 may include a first column of loop coils, a second column of butterfly coils, a third column of loop coils, a fourth column of butterfly coils, and a fifth column of loop coils.

Each RF coil of the RF coil array may be mounted, fixed, or otherwise coupled to a flexible substrate 402, which may be comprised of fabric, foam, or other suitable material. The flexible substrate 402 may include a first foldable seam 404 and a second foldable seam 406. The foldable seams may facilitate folding of the RF coil array. In this way, each first RF coil of each RF coil array element may simultaneously be folded over each second RF coil of each RF coil array element. Likewise, each fifth RF coil of each RF coil array element may simultaneously be folded over each fourth RF coil of each RF coil array element. The foldable RF coil array 400 in a folded configuration 450 is shown in FIG. 4B.

FIG. 5 is a block diagram of an embodiment of a receive section of a magnetic resonance imaging (MRI) system including an RF coil array 201. RF coil array 201 is a non-limiting example of RF coil array 32, RF coil array 110, and/or RF coil array 400 of FIGS. 1, 3A, and 4A, respectively. It should be realized that although the receive section is described with respect to the RF coil array 201, the receive section may be utilized with any of the RF coil arrays described herein.

As illustrated in FIG. 5, various embodiments may be implemented in connection with a receive section 200 of an MRI system. The receive section 200 is configured to acquire MR data using an RF coil array 201 such as the RF coil arrays 32, 110, and 400 described herein. As discussed, the RF coil array 201 that includes a plurality of RF receiver coils 202 (illustrated as a single block element in FIG. 5 for simplicity). For example, the RF coil array 201 may include a plurality of loop and/or butterfly elements that form the RF receiver coils 202. The RF receiver coils 202 are configured to detect MR signals. It should be noted that a subset of the RF receiver coils 202, for example adjacent loop and butterfly elements, may be fully or partially overlapped as described herein. The RF receiver coils 202 are also isolated from each other using preamplifiers 210 that also amplify received MR signals from the RF receiver coils 202. In the exemplary embodiment, the RF coil array 201 is a dedicated receive only coil array. Alternatively, the RF coil array 201 is a switchable array, such as a switchable transmit/receive (T/R) phased array coil. Portions and/or an entirety of the receive section 200 may be referred to herein as a "system".

Thus, the RF coil array 201 forms part of the multi-channel receive section 200 connected to an MRI system. The receive section 200 includes a plurality of channels (Rcvr 1 . . . Rcvr N), for example, twenty channels. However, it should be noted that more or less channels may be provided based on the quantity of RF coils 202 utilized to form the RF coil array 201. In the exemplary embodiment, the RF coil array 201 is connected to the multi-channel receive section 200 having a multi-channel system interface 220 (e.g., a 1.5 T System Interface), with a separate receive channel 222 connected to each one of the plurality of the RF receiver coils 202 (e.g., sixteen channels connected to a four by four coil array).

The system interface 220 may include a plurality of bias control lines 224 (illustrated as two lines) to control the switching of decoupling circuits (not shown), which may be controlled, for example, using a coil configuration file stored in the MRI system and/or based on a user input. For example, based on a user input, a particular coil configuration file may be selected to control the RF coil array 201 configured as a T/R phased array coil in a particular imaging mode (e.g., user control of mode of operation using controls on an MRI scanner). An RF IN control line 226 also may be provided in connection with, for example, a combiner (not shown) to control a transmit coil array.

FIG. 6 is a schematic diagram of a portion of the receive section 200 illustrating an embodiment of one of the RF receiver coils 202 and an embodiment of a corresponding pre-amplifier 210. In the exemplary embodiment, the pre-amplifier 210 has a relatively low input impedance. For example, in some embodiments, a "relatively low" input impedance of the preamplifier 210 is less than approximately 5 ohms at resonance frequency. The input impedance of the preamplifier 210 is defined by an inductor 230, which is shown in FIG. 7. Referring again to FIG. 6, the input impedance of the preamplifier 210 is represented by $Z_{IN}$. In some embodiments, the preamplifier 210 has an input impedance of between approximately 1 ohm and approximately 3 ohms at resonance frequency. Moreover, in some embodiments, the preamplifier 210 has an input impedance of approximately 2 ohms at resonance frequency. It should be noted that for purposes of illustration, all of the capacitors are considered lossless and the inductors are represented with a series resistance. The input impedance of the preamplifier 210 may be referred to herein as a "preamplifier input impedance."

The RF receiver coil 202 includes an RLC resonant circuit formed from a resistor 250, an inductor 252, and a capacitor 254. The RF receiver coil 202 is also connected in series to an impedance transformer 256. More specifically, the impedance transformer 256 is electrically connected between the RF receiver coil 202 and the preamplifier 210. The impedance transformer 256 forms an impedance matching network between the RF receiver coil 202 and the preamplifier 210. The impedance transformer 256 is configured to transform a coil impedance of the RF receiver coil 202 into a source impedance of the preamplifier 210. The source impedance of the preamplifier 210 is represented in FIG. 6 by $Z_{OUT}$. The coil impedance of the RF receiver coil 202 may have any value, which may be dependent on coil loading, coil size, field strength, and/or the like. Examples of the coil impedance of the RF receiver coil 202 include, but are not limited to, between approximately 2 ohms and approximately 10 ohms at 1.5 T field strength, and/or the like.

In one exemplary embodiment, the impedance transformer 256 includes a lattice-type balun. More specifically, the impedance transformer 256 includes two inductors 260 and 262 and two capacitors 264 and 266. The inductor 260 is connected in series to the capacitor 264, while the inductor 262 is connected in series with the capacitor 266. The inductor 260 and the capacitor 264 are connected in parallel to the inductor 262 and the capacitor 266. In the exemplary embodiment, the arrangement of the lattice-type balun impedance transformer 256 produces a +/−90° phase shift. Each of the inductors 260 and 262 may be referred to herein as a "first" and/or a "second" inductor. The capacitors 264 and 266 may be referred to herein as a "first" and/or a "second" capacitor.

The impedance transformer 256 is configured to transform the coil impedance of the RF receiver coil 202 into a relatively high source impedance $Z_{OUT}$. For example, in some embodiments, a "relatively high" source impedance $Z_{OUT}$ is at least approximately 100 ohms. Accordingly, in the exemplary embodiment, the impedance transformer 256 is configured to transform the coil impedance of the RF receiver coil 202 into a source impedance $Z_{OUT}$ of at least approximately 100 ohms. In some embodiments, the impedance transformer 256 is configured to transform the coil impedance of the RF receiver coil 202 into a source impedance $Z_{OUT}$ of at least approximately 300 ohms, at least approximately 400 ohms, or at least approximately 500 ohms. Exemplary values for the inductors 260 and 262 include, but are not limited to, approximately 123.5 nH. Exemplary values for the capacitors 264 and 266 include, but are not limited to, approximately 51 pF.

The impedance transformer 256 also provides a blocking impedance to the RF receiver coil 202. Transformation of the coil impedance of the RF receiver coil 202 to a relative high source impedance $Z_{OUT}$ may enable the impedance transformer 256 to provide a higher blocking impedance to the RF receiver coil 202. Because the relatively high source impedance $Z_{OUT}$ of the preamplifier 210 is greater than, for example, the conventional value of approximately 50 ohms, the reactance X of the inductors 260 and 262 and the capacitors 264 and 266 of the impedance transformer 256 are increased. For example, the reactance XC of each of the capacitors 264 and 266 and the reactance XL of each of the inductors 260 and 262 can be defined by the equation: $XC=XL=\sqrt{(R1 \times R2)}$; where R1 is the coil impedance and R2 is the source impedance $Z_{OUT}$. Because the input impedance $Z_{IN}$ of the preamplifier 210 is relatively low, the impedance transformer 256 forms a parallel resonance circuit that results in a higher impedance at an output 270 of the RF receiver coil 202. As the reactances XC and XL increase, the blocking impedance increases because the blocking impedance is directly proportional to the values of XC and XL. The higher blocking impedance suppresses an increased amount of RF current along the RF receiver coil 202, which may ultimately result in a higher SNR ratio because of fewer interactions between RF receiver coils 202 and/or less correlated noise. Exemplary values for such higher blocking impedances include, for example, a blocking impedance of at least 500 ohms, and at least 1000 ohms.

The impedance transformer 256 is not limited to a lattice-type balun structure for transforming the coil impedance of the RF receiver coil 202 into a relatively high source impedance. Rather, any components and arrangement of the connections therebetween may be used to transform the coil impedance of the RF receiver coil 202 into a relatively high source impedance, such as, but not limited to, other types of equivalent phase shift baluns, and/or the like.

FIG. 7 is a schematic diagram illustrating an embodiment of the preamplifier 210 shown in FIG. 5. The preamplifier 210 is configured to accommodate the relatively high source impedance $Z_{OUT}$ while providing the relatively low input impedance $Z_{IN}$. The input impedance $Z_{IN}$ of the preamplifier 210 is defined by the inductor 230 of the preamplifier 210. The preamplifier 210 includes an amplifier 280 that receives MR signals from the corresponding RF receiver coil 202 and amplifies the received MR signals. An input circuit 282 is electrically connected to the amplifier 280. The input circuit 282 is electrically connected to the output 270 (shown in FIG. 6) of the corresponding RF receiver coil 202, via the impedance transformer 256 (shown in FIG. 6). The input circuit 282 is configured to transmit the MR signals from the corresponding RF receiver coil 202 to the amplifier 280.

The input circuit 282 includes an impedance transformer 284, which includes a capacitor 286 and the inductor 230. The input circuit 282 also includes a field effect transistor (FET) 288 that is electrically connected between the impedance transformer 284 and the amplifier 280, for example as shown in FIG. 6. The impedance transformer 284 is electrically connected between the amplifier 280 and the corresponding RF receiver coil 202.

In the exemplary embodiment, the FET 288 has a relatively large noise circle, which may be centered in the Smith Chart, for the FET 288 to yield a relatively low noise figure. In other words, the FET 288 is capable of providing a relatively low noise figure over a relatively broad range of source impedance $Z_{OUT}$. For example, in some embodiments, a "relatively large" size of the noise circle of the FET 288 is at least approximately 0.3 decibels. In some embodiments, the noise circle of the FET 288 has a size of at least approximately 0.6 decibels. The size of the noise circle of the FET 288 is dependent on the noise resistance RN of the FET 288. The FET 288 may have any value of noise resistance RN that provides a noise circle having a size of at least 0.3 decibels, such as, but not limited to, less than approximately 0.03 ohms, equal to or less than approximately 0.02 ohms, and/or the like. The location of the noise circle of the FET 288 within the Smith Chart is dependent on the optimum reflection coefficient of the FET 288. For example, the noise circle of the FET 288 may be located closer to the center of the Smith Chart (i.e., closer to being concentric) when the optimum reflection coefficient of the FET 288 is less than approximately 100 ohms. In some embodiments, the noise circle of the FET 288 is centered within the Smith Chart (i.e., concentric with the Smith Chart). In some embodiments, and for example, the FET 288 has an optimum reflection coefficient of less than approximately 100 ohms. In some embodiments, and for example, the FET 288 has an optimum reflection coefficient of between approximately 40 ohms and approximately 60 ohms, for example approximately 50 ohms.

Figure 8:
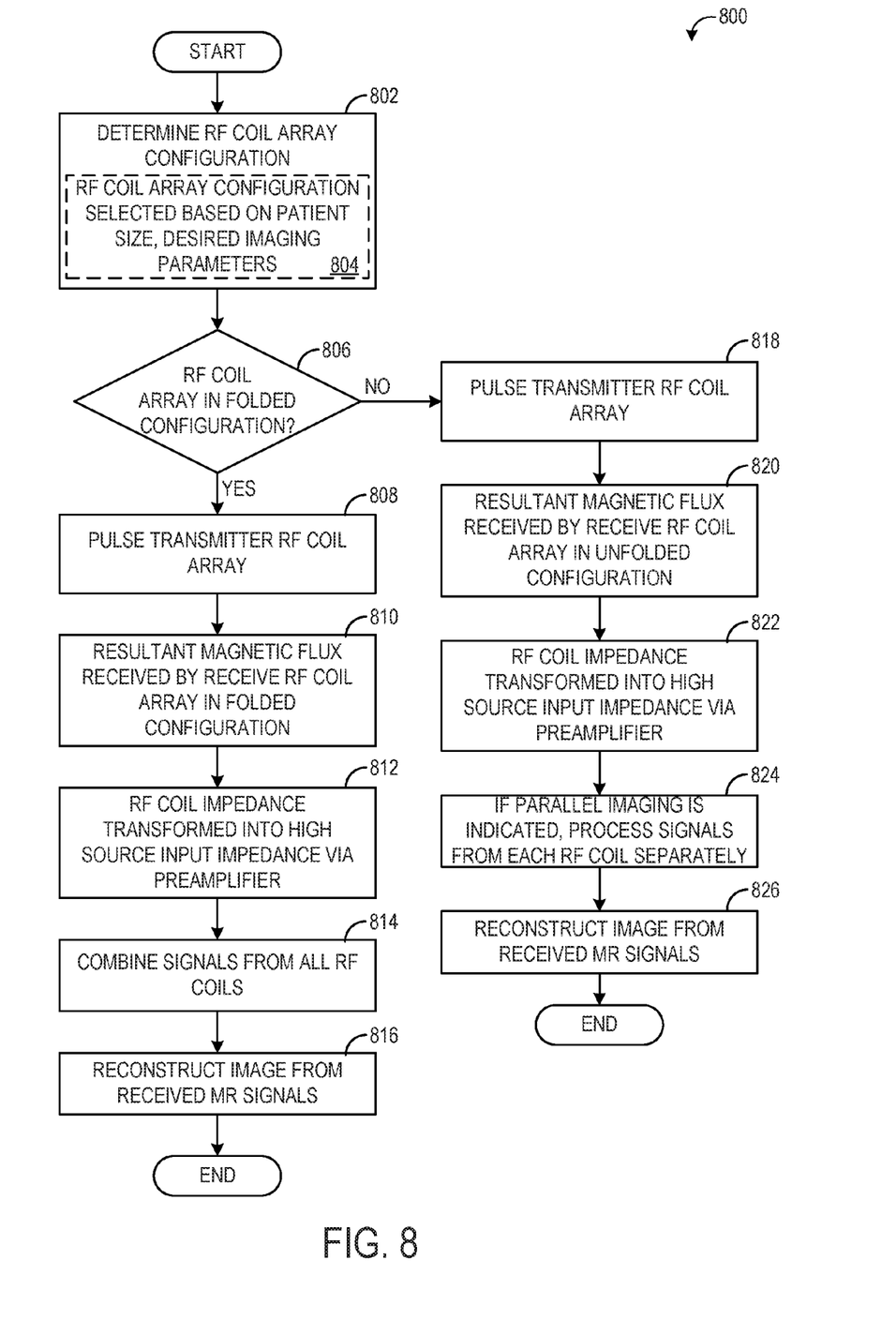
FIG. 8 is a flow chart illustrating a method for operating an MRI system having a foldable RF coil array.

Turning to FIG. 8, a method 800 for operating a magnetic resonance imaging (MRI) system is provided. Method 800 may be at least partially carried out by a processor, such as a processor of control circuit 36 of FIG. 1, in order to perform imaging using a foldable RF coil array, such as RF coil array 110 of FIGS. 3A and 3B and/or RF coil array 400 of FIG. 4A.

At 802, method 800 includes determining an RF coil array configuration. The foldable RF coil array may be adjustable to an unfolded (e.g., partial overlap) configuration, as described above with respect to FIG. 3A, or to a folded (e.g., full overlap) configuration, as described above with respect to FIG. 3B. The RF coil array configuration may be selected based on patient or anatomy size and/or desired imaging parameters, as indicated at 804. In one example, if a relatively large patient is being imaged, or if a relatively large portion of anatomy is being imaged, the unfolded configuration may be selected, while if a relatively small patient or small portion of anatomy is being imaged, the folded configuration may be selected. In another example, if a high SNR is desired, the folded configuration may be selected, while if parallel imaging is desired, the unfolded configuration may be selected. The selection of the RF coil array configuration may be made by an operator in one example. In another example, the selection may be made automatically by the processor based on user input of desired imaging parameters, anatomy being imaged, and/or determination of patient size.

At 806, method 800 includes determining if the RF coil array is in a folded configuration. In one example, the determination may be made based on user input. In another example, the determination may be assumed based on the type of imaging being performed, e.g., torso vs. head imaging, parallel vs. non-parallel imaging, etc.

If the RF coil is in the folded configuration, method 800 proceeds to 808 to pulse a transmitter RF coil array. In one example, the foldable RF coil array may be a transmit/receive array, and thus pulsing the transmitter RF coil array may include pulsing the foldable RF coil array (in the folded configuration). In another example, the foldable RF coil array may be a receive only array, and thus pulsing the transmitter RF coil array may include pulsing a separate array.

The magnetic flux that results from the pulsing of the transmitter RF coil array induces a current in the receive RF coil array (e.g., in the foldable RF coil array), which current is subsequently amplified and processed to reconstruct an image of the patient/region of interest. Thus, at 810, method 800 includes receiving the resultant magnetic flux by the foldable RF coil array in the folded configuration. At 812, the RF coil impedance is transformed into high source input impedance via a preamplifier, as explained above with respect to FIGS. 5-7. Each RF coil of the foldable RF coil array may be coupled to a respective pre-amplifier as described above, and thus the impedance of each RF coil may be transformed. In doing so, coupling between adjacent RF coils may be reduced.

At 814, the MR signals from all the RF coils from the foldable RF coil array are combined, and the combined signal is used to reconstruct an image of the region of interest, as indicated at 816. Method 800 then returns.

Returning to 806, if is determined that the foldable RF coil array is not in the folded configuration, the foldable RF coil array is hence in the unfolded configuration and method 800 proceeds to 818 to pulse the transmitter RF coil array (which may be the foldable RF coil array or a separate array, as explained above). The resultant magnetic flux is received by the foldable RF coil array in the unfolded configuration, as indicated at 820. At 822, the RF coil impedance from each RF coil of the foldable RF coil array is transformed into high source input impedance via a respective preamplifier, as explained above. At 824, if parallel imaging is indicated (e.g., based on user input), each signal from each RF coil is processed separately, and at 826, an image is reconstructed from the received, separate MR signals. Method 800 then returns.

A technical effect of the disclosure is providing an adjustable RF coil array to accommodate imaging of a variety of patient sizes while increasing SNR.

In one embodiment, a foldable radiofrequency (RF) coil array includes a first RF coil configured to generate a magnetic field along a first axis, the first RF coil having a first surface; a second RF coil configured to generate a magnetic field along a second axis, orthogonal to the first axis, the second RF coil having a second surface; and a first foldable interconnect coupling the first RF coil to the second RF coil, where in an unfolded configuration, the first foldable interconnect is configured to couple the first RF coil to the second RF coil with a first amount of overlap and with the first surface and second surface facing a common direction, and in a folded configuration, the first foldable interconnect is configured to couple the first RF coil to the second RF coil with a second amount of overlap, larger than the first amount of overlap, and with the first surface in face to face position with the second surface. The first amount of overlap may include 10% or less of a width the first RF coil overlapping with the second RF coil, and the second amount of overlap may include 90% or greater of the width the first RF coil overlapping with the second RF coil. In one example, the second amount of overlap may include full overlap where 100% of the width of the first RF coil overlaps the second RF coil. The first foldable interconnect may include a hinge configured to rotate to allow the first RF coil to move from the unfolded configuration to the folded configuration. In an example, the first RF coil is a loop RF coil and the second RF coil is a butterfly RF coil. The butterfly RF coil may include a cross-over region, wherein in the unfolded configuration, the loop RF coil does not overlap the cross-over region, and wherein in the folded configuration, the loop RF coil overlaps the cross-over region.

The foldable RF coil array may further include a third RF coil configured to generate a magnetic field along the first axis; a fourth RF coil configured to generate a magnetic field along the second axis; a fifth RF coil configured to generate a magnetic field along the first axis; and a second foldable interconnect coupling the fifth RF coil to the fourth RF coil. The first RF coil may be separated from the third RF coil by a first distance in the unfolded configuration and may be separated from the third RF coil by a second distance in the folded configuration, the second distance less than the first distance, and the second RF coil and fourth RF coil may be separated by a third distance in both the folded configuration and the unfolded configuration. In the unfolded configuration, the RF coil array may have a first length defined by a first outermost edge of the first RF coil and a second outermost edge of the fifth RF coil, and in the folded configuration, the RF coil array may have a second length defined by a first outermost edge of the second RF coil and a second outermost edge of the fourth RF coil. In the unfolded configuration, the second RF coil, third RF coil, and fourth RF may each be positioned intermediate the first RF coil and the fifth RF coil, and in the folded configuration, the first RF coil, third RF coil, and fifth RF coil may each be positioned intermediate the second RF coil and fourth RF coil.

The first RF coil, second RF coil, and first foldable interconnect may define a first coil element, and the RF coil array may further include one or more additional coil elements each comprising a respective first RF coil, second RF coil, and first foldable interconnect, the first coil element and one or more additional coil elements arranged into rows. The first coil element and one or more additional coil elements may be mounted on a flexible substrate, the flexible substrate having a foldable seam aligned with each first foldable interconnect of each coil element.

The RF coil array may further include a preamplifier coupled to the first RF coil, the preamplifier including an amplifier and an impedance transformer to transform a coil impedance of the first RF coil to a source impedance of at least approximately 100 ohms.

In an embodiment, a magnetic resonance imaging (MRI) system, comprises a gantry having a bore extending therethrough; and a radio frequency (RF) coil array configured to be inserted into the bore, the RF coil array comprising: an RF coil flexible substrate; and a plurality of RF coils coupled to the RF coil flexible substrate, the RF coil flexible substrate configured to enable the plurality of RF coils to be positioned in a partial overlap configuration and repositioned to a full overlap configuration. The plurality of RF coils may include a first set of loop coils arranged in a first column and a second set of butterfly coils arranged in a second, adjacent column. In the partial overlap configuration, the first set of loop coils and second set of butterfly coils may overlap by less than threshold amount, and in full overlap configuration, the first set of loop coils and second set of butterfly coils may fully overlap. The MRI system may further include a control circuit configured to reconstruct an image based on signals received by the plurality of RF coils. The control circuit may be configured to reconstruct the image according to a parallel imaging protocol when the RF coil array is the partial overlap configuration.

In an embodiment, a method includes, during a first condition, receiving a first plurality of magnetic resonance (MR) signals via a radiofrequency (RF) coil array arranged in a partial overlap configuration, and generating one or more images of a first region of interest based on the received first plurality of MR signals; and during a second condition, receiving a second plurality of MR signals via the RF coil array arranged in a full overlap configuration, and generating one or more images of a second region of interest based on the received second plurality of MR signals. The first condition may comprise the first region of interest being larger than a threshold, and the second condition may comprise the second region of interest being smaller than the threshold. The RF coil array may include a first set of loop coils arranged in a first column and a second set of butterfly coils arranged in a second, adjacent column. In the partial overlap configuration, the first set of loop coils and second set of butterfly coils may overlap by less than threshold amount, and in the full overlap configuration, the first set of loop coils and second set of butterfly coils may fully overlap. In one example, generating one or more images of the second region of interest based on the received second plurality of MR signals includes generating one or more images of the second region of interest using parallel imaging.

In any of the above described embodiments, an amplifier may be configured to receive at least one magnetic resonance (MR) signal from an RF coil and configured to generate an amplified MR signal; and an input circuit may be electrically connected to the amplifier, the input circuit being configured to be electrically connected to an output of the RF coil for transmitting the at least one MR signal from the RF coil to the amplifier, the input circuit comprising an impedance transformer and a field effect transistor (FET), the FET being electrically connected between the impedance transformer and the amplifier, the FET having an FET impedance, the impedance transformer being configured to transform a source impedance of at least approximately 100 ohms, the impedance transformer being further configured to transform the FET impedance into a preamplifier input impedance of less than approximately 5 ohms. The impedance transformer may be configured to transform the source impedance into an impedance that is within a 0.3 dB noise circle of the FET.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A foldable radiofrequency (RF) coil array, comprising:
   a first RF coil configured to generate a magnetic field along a first axis, the first RF coil having a first surface;
   a second RF coil configured to generate a magnetic field along a second axis, orthogonal to the first axis, the second RF coil having a second surface; and
   a first foldable interconnect coupling the first RF coil to the second RF coil, where in an unfolded configuration, the first foldable interconnect is configured to couple the first RF coil to the second RF coil with a first amount of overlap and with the first surface and second surface facing a common direction, and in a folded configuration, the first foldable interconnect is configured to couple the first RF coil to the second RF coil with a second amount of overlap, larger than the first amount of overlap, and with the first surface in face to face position with the second surface.

2. The foldable RF coil array of claim 1, wherein the first amount of overlap comprises 10% or less of a width the first RF coil overlapping with the second RF coil, and wherein the second amount of overlap comprises 90% or greater of the width the first RF coil overlapping with the second RF coil.

3. The foldable RF coil array of claim 1, wherein the first foldable interconnect comprises a hinge configured to rotate to allow the first RF coil to move from the unfolded configuration to the folded configuration.

4. The foldable RF coil array of claim 1, wherein the first RF coil is a loop RF coil and the second RF coil is a butterfly RF coil.

5. The foldable RF coil array of claim 4, wherein the butterfly RF coil includes a cross-over region, wherein in the unfolded configuration, the loop RF coil does not overlap the cross-over region, and wherein in the folded configuration, the loop RF coil overlaps the cross-over region.

6. The foldable RF coil array of claim 1, further comprising:
   a third RF coil configured to generate a magnetic field along the first axis;
   a fourth RF coil configured to generate a magnetic field along the second axis;
   a fifth RF coil configured to generate a magnetic field along the first axis; and
   a second foldable interconnect coupling the fifth RF coil to the fourth RF coil.

7. The foldable RF coil array of claim 6, wherein the first RF coil is separated from the third RF coil by a first distance in the unfolded configuration and is separated from the third RF coil by a second distance in the folded configuration, the second distance less than the first distance, and wherein the second RF coil and fourth RF coil are separated by a third distance in both the folded configuration and the unfolded configuration.

8. The foldable RF coil array of claim 6, wherein in the unfolded configuration, the RF coil array has a first length defined by a first outermost edge of the first RF coil and a second outermost edge of the fifth RF coil, and in the folded configuration, the RF coil array has a second length defined by a first outermost edge of the second RF coil and a second outermost edge of the fourth RF coil.

9. The foldable RF coil array of claim 6, wherein in the unfolded configuration, the second RF coil, third RF coil, and fourth RF coil are each positioned intermediate the first RF coil and the fifth RF coil, and in the folded configuration, the first RF coil, third RF coil, and fifth RF coil are each positioned intermediate the second RF coil and fourth RF coil.

10. The foldable RF coil array of claim 1, wherein the first RF coil, second RF coil, and first foldable interconnect define a first coil element, and further comprising one or more additional coil elements each comprising a respective first RF coil, second RF coil, and first foldable interconnect, the first coil element and one or more additional coil elements arranged into rows.

11. The foldable RF coil array of claim 10, wherein the first coil element and one or more additional coil elements are mounted on a flexible substrate, the flexible substrate having a foldable seam aligned with each first foldable interconnect of each coil element.

12. The RF coil array of claim 1, further comprising a preamplifier coupled to the first RF coil, the preamplifier comprising:
an amplifier;
an impedance transformer to transform a coil impedance of the first RF coil to a source impedance of at least approximately 100 ohms.

\* \* \* \* \*